United States Patent
Jeong et al.

(10) Patent No.: US 10,950,473 B2
(45) Date of Patent: Mar. 16, 2021

(54) HEAT SOURCE DEVICE AND SUBSTRATE PROCESSING APPARATUS INCLUDING SAME

(71) Applicant: NPS Corporation, Hwaseong-Si (KR)

(72) Inventors: Ji Young Jeong, Osan-Si (KR); Kyung Chun Jung, Suwon-Si (KR)

(73) Assignee: NPS Corporation

( * ) Notice: Subject to any disclaimer, the term of this patent is extended or adjusted under 35 U.S.C. 154(b) by 379 days.

(21) Appl. No.: 15/904,353

(22) Filed: Feb. 24, 2018

(65) Prior Publication Data

US 2018/0286712 A1 Oct. 4, 2018

(30) Foreign Application Priority Data

Mar. 29, 2017 (KR) .................. 10-2017-0040014

(51) Int. Cl.
*H01L 21/67* (2006.01)
*H05B 3/00* (2006.01)

(52) U.S. Cl.
CPC .. *H01L 21/67115* (2013.01); *H01L 21/67109* (2013.01); *H05B 3/0042* (2013.01)

(58) Field of Classification Search
CPC ......... H01L 21/67115; H01L 21/67109; H05B 3/0042
USPC ...................... 392/416, 418, 407, 483, 465
See application file for complete search history.

(56) References Cited

U.S. PATENT DOCUMENTS

| | | | | |
|---|---|---|---|---|
| 1,767,122 A | * | 6/1930 | Dean ..................... | F24H 1/142 392/492 |
| 2,589,566 A | * | 3/1952 | Neth ..................... | F24H 3/004 392/479 |
| 3,573,452 A | * | 4/1971 | Kenyon ................ | F21V 29/83 362/294 |
| 3,609,335 A | * | 9/1971 | Kelly .................... | F21V 29/02 362/33 |
| 4,101,424 A | * | 7/1978 | Schooley .............. | F21V 13/04 250/504 R |

(Continued)

FOREIGN PATENT DOCUMENTS

| JP | 10004080 A | 1/1998 |
|---|---|---|
| JP | 2775816 B2 | 7/1998 |

(Continued)

*Primary Examiner* — Jimmy Chou
(74) *Attorney, Agent, or Firm* — Renaissance IP Law Group LLP

(57) ABSTRACT

The present disclosure relates to a heat source device and a substrate processing apparatus including same. The substrate processing apparatus includes: a chamber having an inner space in which a substrate is processed; a substrate support provided inside the chamber and supporting the substrate; and a heat source device including a supporting body provided in at least one side of the chamber, and a heat source unit provided parallel to the substrate support so as to heat the substrate. The heat source unit is provided with a first light transmission conduit connected to the supporting body, a heat source provided inside the first light transmission conduit, and a first cooling conduit provided inside the first light transmission conduit while being spaced apart from the heat source, and having a first spraying hole to spray a cooling gas. The temperature of the substrate may be efficiently controlled.

17 Claims, 9 Drawing Sheets

(56) References Cited

U.S. PATENT DOCUMENTS

| | | | | |
|---|---|---|---|---|
| 5,559,924 A * | 9/1996 | Kadotani | | F24H 1/142 392/483 |
| 6,091,890 A * | 7/2000 | Gruzdev | | H05B 3/0052 392/485 |
| 6,703,589 B1 * | 3/2004 | Probst | | H01L 21/67115 118/224 |
| 6,707,011 B2 * | 3/2004 | Tay | | H01L 21/67115 118/50.1 |
| 6,805,466 B1 * | 10/2004 | Ranish | | H01L 21/67115 219/405 |
| 7,509,035 B2 * | 3/2009 | Ranish | | H01L 21/67115 118/50.1 |
| 7,593,625 B2 * | 9/2009 | Kamikawa | | F24H 1/101 392/393 |
| 7,668,444 B2 * | 2/2010 | Tsai | | H05B 3/44 392/407 |
| 8,682,149 B2 * | 3/2014 | Tiras | | G01F 1/42 392/497 |
| 8,983,280 B2 * | 3/2015 | Fujita | | F26B 13/10 392/416 |
| 9,062,894 B2 * | 6/2015 | Miyazaki | | F28D 7/12 |
| 2002/0148824 A1 * | 10/2002 | Hauf | | H01L 21/67115 219/411 |
| 2003/0026603 A1 * | 2/2003 | Castaneda | | H05B 3/0052 392/483 |
| 2003/0173347 A1 * | 9/2003 | Guiver | | H01L 21/67017 219/390 |
| 2004/0013419 A1 * | 1/2004 | Sakuma | | H01L 21/68792 392/411 |
| 2004/0035847 A1 * | 2/2004 | Gat | | H01L 21/67115 219/444.1 |
| 2004/0175162 A1 * | 9/2004 | Linow | | H05B 3/0052 392/424 |
| 2005/0098553 A1 * | 5/2005 | Devine | | F27D 5/0037 219/411 |
| 2006/0086713 A1 * | 4/2006 | Hunter | | F27B 17/0025 219/411 |
| 2009/0212037 A1 * | 8/2009 | Ranish | | H01L 21/67115 219/405 |
| 2010/0059497 A1 * | 3/2010 | Ranish | | H01L 21/67115 219/395 |
| 2012/0031332 A1 * | 2/2012 | Yokota | | H01L 21/67115 118/715 |
| 2012/0063754 A1 * | 3/2012 | Nishida | | F24H 1/162 392/424 |
| 2012/0270168 A1 * | 10/2012 | Ranish | | H01L 21/67115 432/29 |
| 2012/0328272 A1 * | 12/2012 | Fujita | | F26B 3/30 392/416 |
| 2014/0079376 A1 * | 3/2014 | Tseng | | H01L 21/67098 392/416 |
| 2014/0254150 A1 * | 9/2014 | Ranish | | C23C 16/4411 362/235 |
| 2015/0348809 A1 * | 12/2015 | Iu | | H01L 21/67115 392/416 |
| 2016/0027671 A1 * | 1/2016 | Ranish | | G02B 6/0005 392/416 |
| 2016/0111306 A1 * | 4/2016 | Ranish | | H01L 21/67115 392/416 |
| 2017/0105249 A1 * | 4/2017 | Ranish | | H05B 3/0047 |

FOREIGN PATENT DOCUMENTS

| | | |
|---|---|---|
| JP | 5063995 B2 | 10/2012 |
| JP | 20120113665 A | 10/2012 |
| JP | 5531385 B2 | 6/2014 |
| KR | 101398970 B1 | 5/2014 |
| KR | 101431606 B1 | 8/2014 |
| KR | 101546320 B1 | 8/2015 |

* cited by examiner

HEAT SOURCE DEVICE AND SUBSTRATE PROCESSING APPARATUS INCLUDING SAME

CROSS-REFERENCE TO RELATED APPLICATION

This application claims priority to Korean Patent Application No. 10-2017-0040014 filed on Mar. 29, 2017 and all the benefits accruing therefrom under 35 U.S.C. § 119, the contents of which are incorporated by reference in their entirety.

BACKGROUND

The present disclosure relates to a heat source device and a substrate processing apparatus, and more particularly, a heat source device and a substrate processing apparatus including same, wherein the heat source device is capable of efficiently control a temperature of a substrate.

Recently, a rapid thermal processing (RTP) method has been widely used as a heat treatment method of a substrate.

The RTP method is performed in such a manner in which radiation light emitted from heat sources such as a tungsten lamp is radiated to a substrate so as to thermally treat the substrate. When compared to a heat treatment method of the related art using a furnace, this RTP method may rapidly heat or cool the substrate, easily regulate and control a pressure condition and a temperature range, thereby improving a heat treatment quality of the substrate.

The graphene is a conductive material that has a thickness of one atomic layer in which carbon atoms form a honeycomb are arranged on a two-dimension, and has been an important model to research various low-dimensional nanophenomena. Also, the graphene is significantly stable structurally and chemically and also is a very excellent conductive material, and it has been expected that the graphene can move electrons approximately 100 times faster than silicon, and can flow 100 times more electrons than copper.

The graphene is composed of carbon that is a light-weight element, and thus one-dimensional or two-dimensional nano pattern can be easily processed. Particularly, when using the above-described characteristics, semiconductor-conductor properties can be controlled, and a wide range of functional elements such as a sensor and a memory can be manufactured using the diversity of chemical bonds involved in carbon.

Recently, a chemical vapor deposition (CVD) method by means of the RTP has been introduced as the technique to synthesize the graphene. It has been possible to synthesize the graphene with a large surface area through the CVD method by means of the RTP. In this method, the quality of graphene is influenced by a temperature of a substrate on which the graphene is deposited. Particularly, it is required to rapidly and uniformly decrease a temperature of the substrate after the deposition of graphene.

Therefore, a method for directly cooling the substrate by supplying a cooling gas into a chamber has been used. However, due to residual heat of a heat source and a difference between cooling rates of the heat source, a temperature deviation according to positions of the substrate occurs, and this deviation affects the quality of graphene.

RELATED ART DOCUMENT

Patent Documents (Patent Document 1) KR1398970 B
(Patent Document 2) JP5531385 B

SUMMARY

The present disclosure provides a heat source device capable of rapidly cooling a heat source, and a substrate processing apparatus including same.

The present disclosure also provides a heat source device capable of uniformly controlling a temperature of a substrate, and a substrate processing apparatus including same.

In accordance with an exemplary embodiment, a heat source device includes: a first light transmission conduit having a hollow shape; a heat source inserted into and fixed to the first light transmission conduit; and a first cooling conduit disposed inside the first light transmission conduit while being spaced apart from the heat source, and having a first spraying hole to spray a cooling gas.

The heat source device may include a supporting body in which an open hollow shape is defined in one side and a first insertion hole is defined in a side surface, wherein the first light transmission conduit is fixed into the first insertion hole and disposed to pass through the supporting body.

The first light transmission conduit may have, at both ends, a first fixing hole to fix the heat source and a second fixing hole to fix the first cooling conduit, and a discharging hole may be defined between the first fixing hole and the second fixing hole so as to discharge the cooling gas to the outside.

The first spraying hole may be provided in plurality, and the first spraying holes may be spaced apart from each other in a longitudinal direction of the first cooling conduit, and the plurality of first spraying holes may have the same diameter.

The first spraying hole may be provided in plurality, and the first spraying holes may be spaced apart from each other in a longitudinal direction of the first cooling conduit, and the plurality of first spraying holes may have diameters that decrease gradually from a center to both edges in a longitudinal direction of the first cooling conduit.

The first spraying hole may provided in plurality, and the first spraying holes may be spaced apart from each other in a longitudinal direction and a circumferential direction of the first cooling conduit.

The supporting body may have a second insertion hole defined on the side surface thereof, and the heat source may include an auxiliary cooling unit fixed into the second insertion hole and disposed parallel to the first light transmission conduit.

The auxiliary cooling unit may include: a second light transmission conduit having a hollow shape; and a second cooling conduit provided inside the second light transmission conduit and having a second spraying hole to spray a cooling gas.

The auxiliary cooling unit may be provided in one side of the first light transmission conduit.

The heat source device may include a first sensor to measure a temperature of the first light transmission conduit.

The heat source device may include a first regulator provided in a supply conduit to supply a cooling gas to the first cooling conduit, and the first regulator may regulate a supply amount and a supply pressure of the cooling gas.

The heat source device may include a second regulator provided in the supply conduit to supply the cooling gas to the first cooling conduit, and the second regulator may control a temperature of the cooling gas.

In accordance with another exemplary embodiment, a substrate processing apparatus includes: a chamber having an inner space in which a substrate is processed; a substrate support provided inside the chamber and supporting the substrate; and a heat source device including a supporting body provided in at least one side of the chamber, and a heat source unit provided parallel to the substrate support so as to heat the substrate, wherein the heat source unit includes: a first light transmission conduit connected to the supporting body; a heat source provided inside the first light transmission conduit; and a first cooling conduit provided inside the first light transmission conduit while being spaced apart from the heat source, and having a first spraying hole to spray a cooling gas.

The heat source device may include a plurality of heat source units and a first regulator that regulates a supply amount and a supply pressure of the cooling gas supplied to each of heat source units.

The heat source device may include a second regulator that controls a temperature of the cooling gas.

The first light transmission conduit may have a discharge hole through which the cooling gas is discharged to the outside.

The heat source device may include an auxiliary cooling unit connected to the supporting body and disposed parallel to the heat source unit.

The auxiliary cooling unit may include: a second light transmission conduit having a hollow shape; and a second cooling conduit provided inside the second light transmission conduit and having a second spraying hole to spray a cooling gas.

The auxiliary cooling unit may be disposed closer to the substrate support than the heat source unit.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
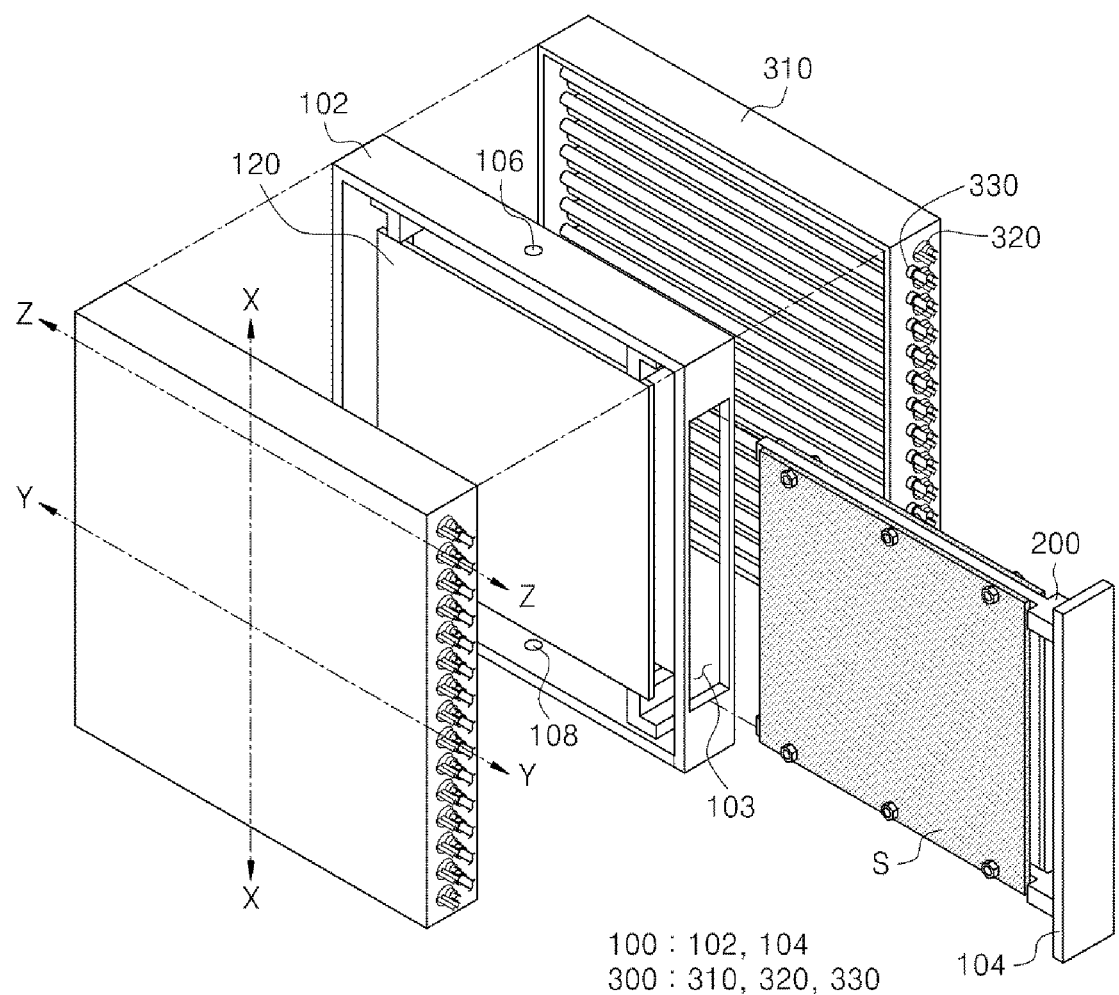
FIG. 1 a view schematically showing a configuration of a substrate processing apparatus in accordance with an exemplary embodiment.

Hereinafter, exemplary embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the figures, like reference numerals refer to like elements throughout.

Figure 2:
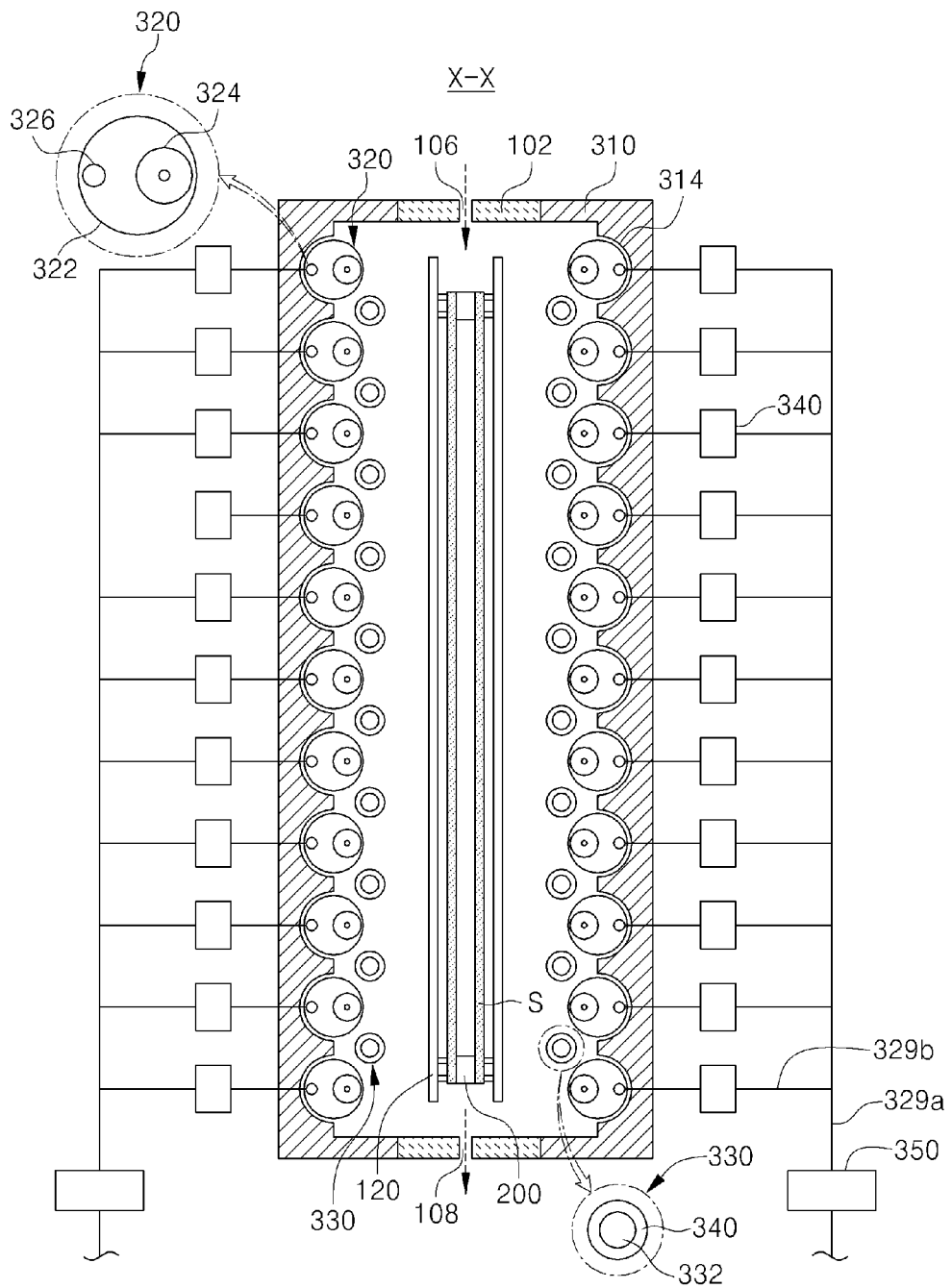
FIG. 2 is a cross-sectional view of a substrate processing apparatus, taken along line X-X of FIG. 1.
Figure 3:
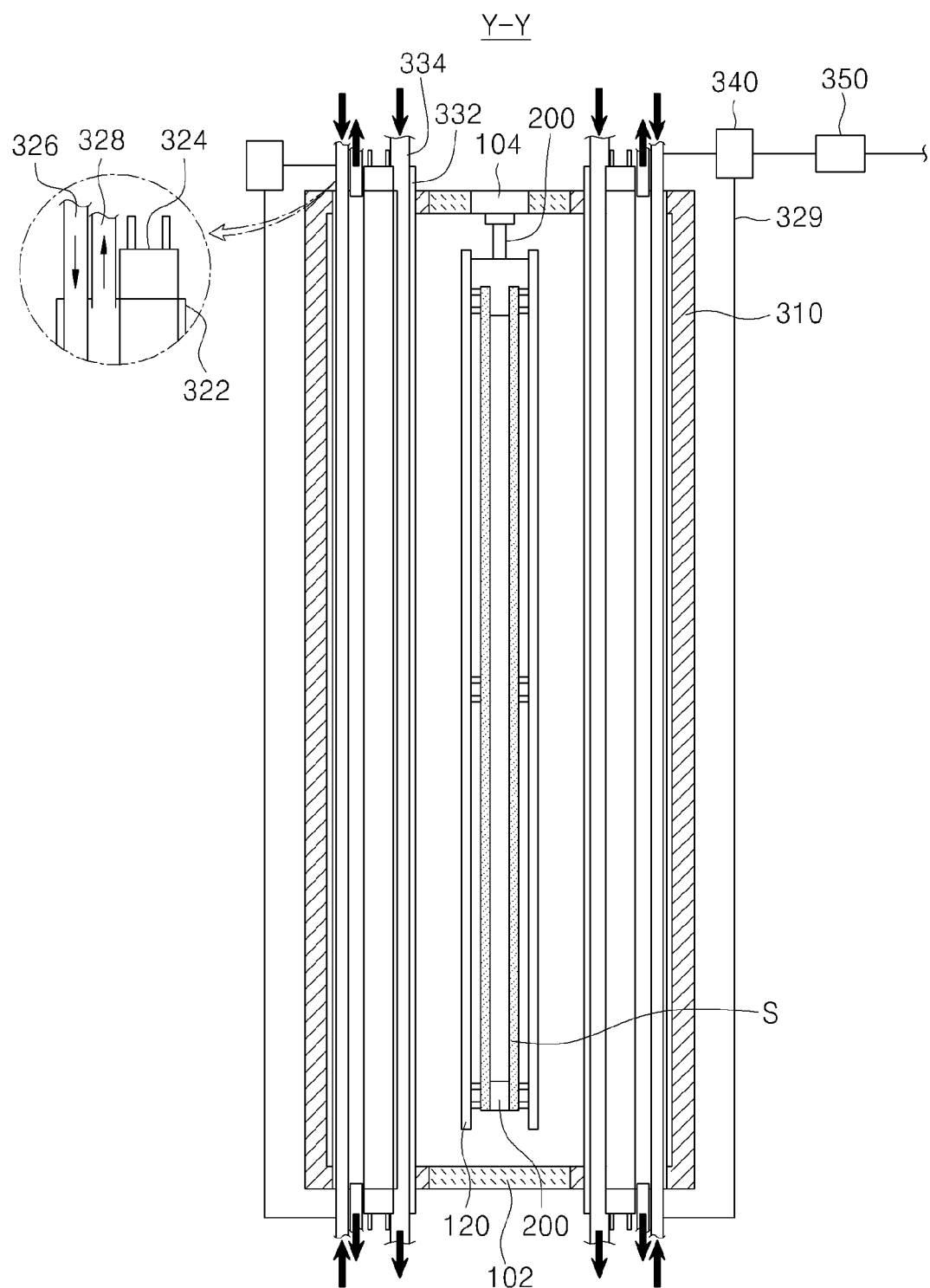
FIG. 3 is a cross-sectional view of a substrate processing apparatus, taken along line Y-Y of FIG. 1.
Figure 4:
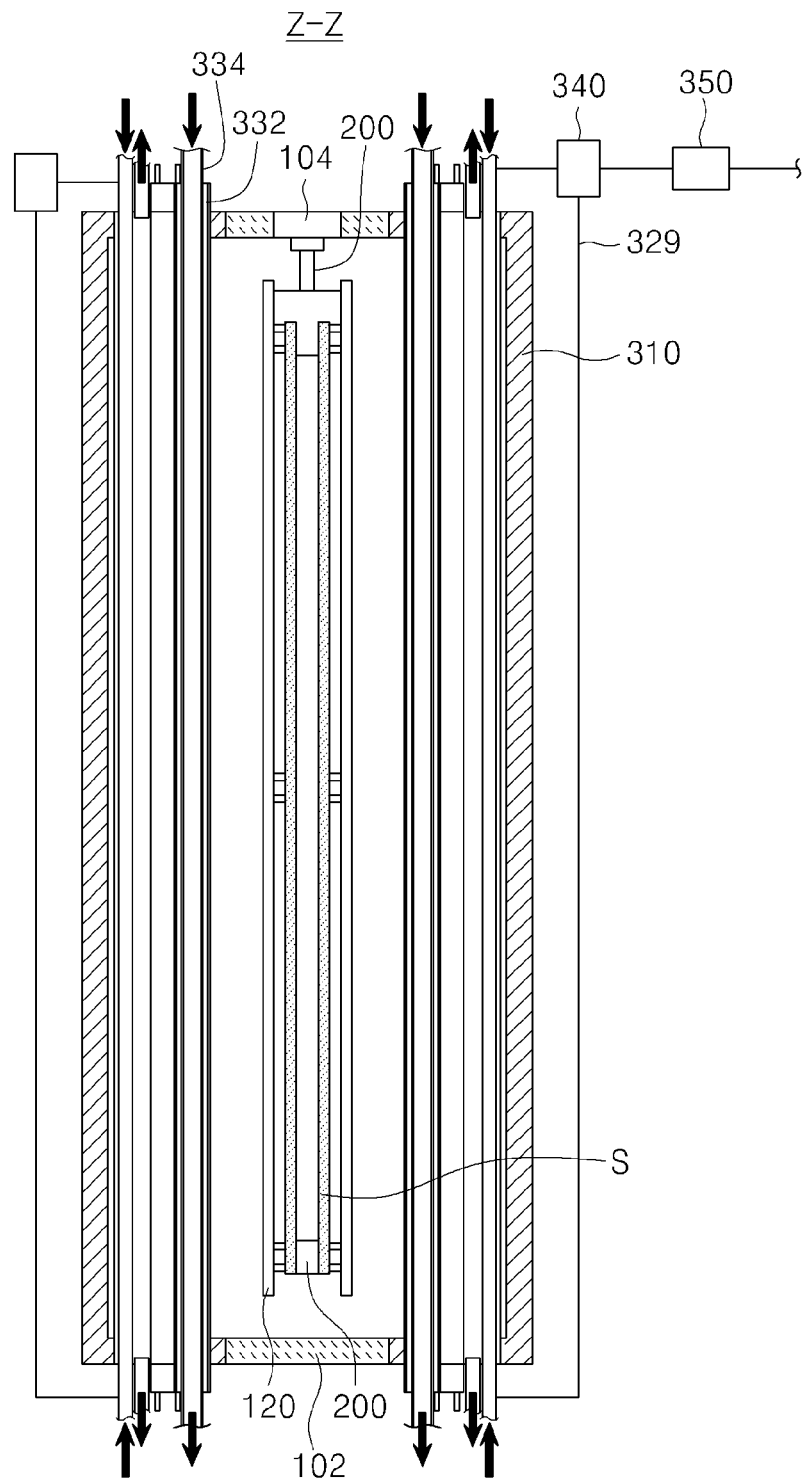
FIG. 4 is a cross-sectional view of a substrate processing apparatus, taken along line Z-Z of FIG. 1.
Figure 5:
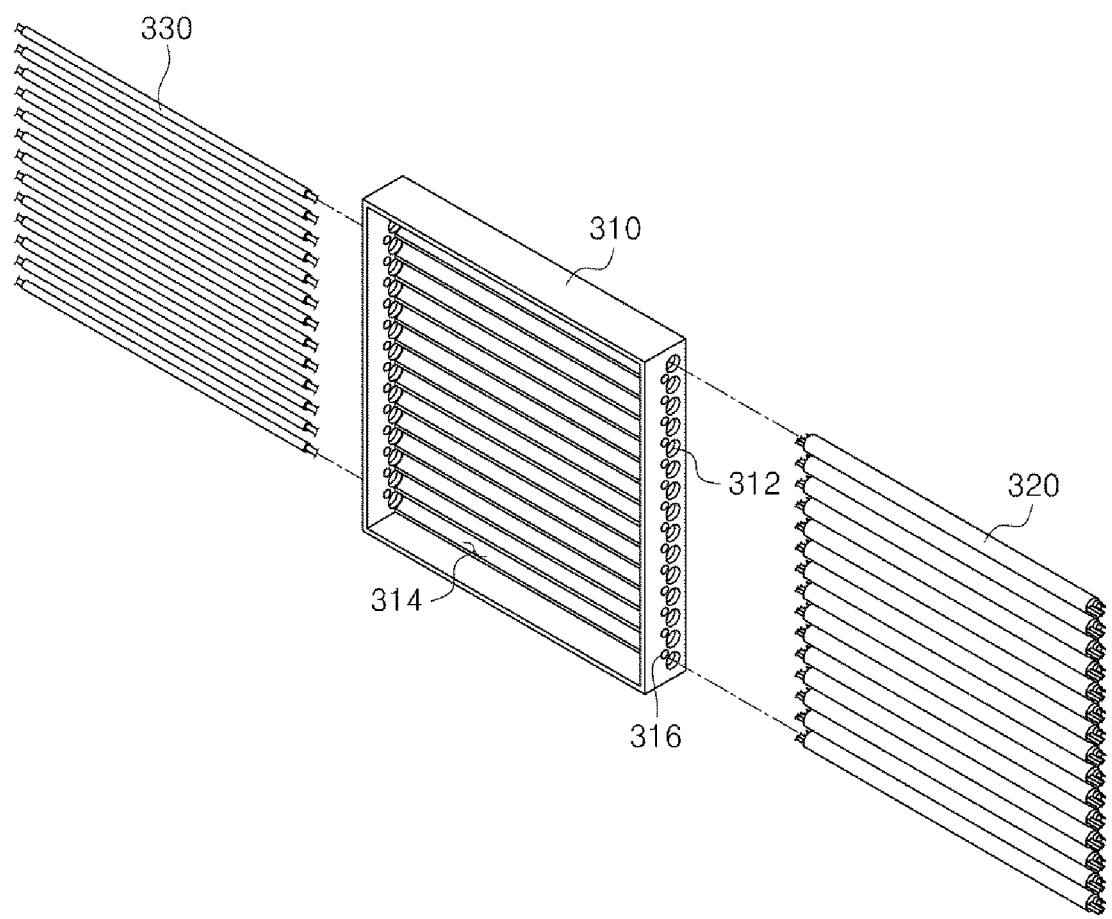
FIG. 5 is an exploded perspective view of a heat source device in accordance with an exemplary embodiment.
Figure 6:
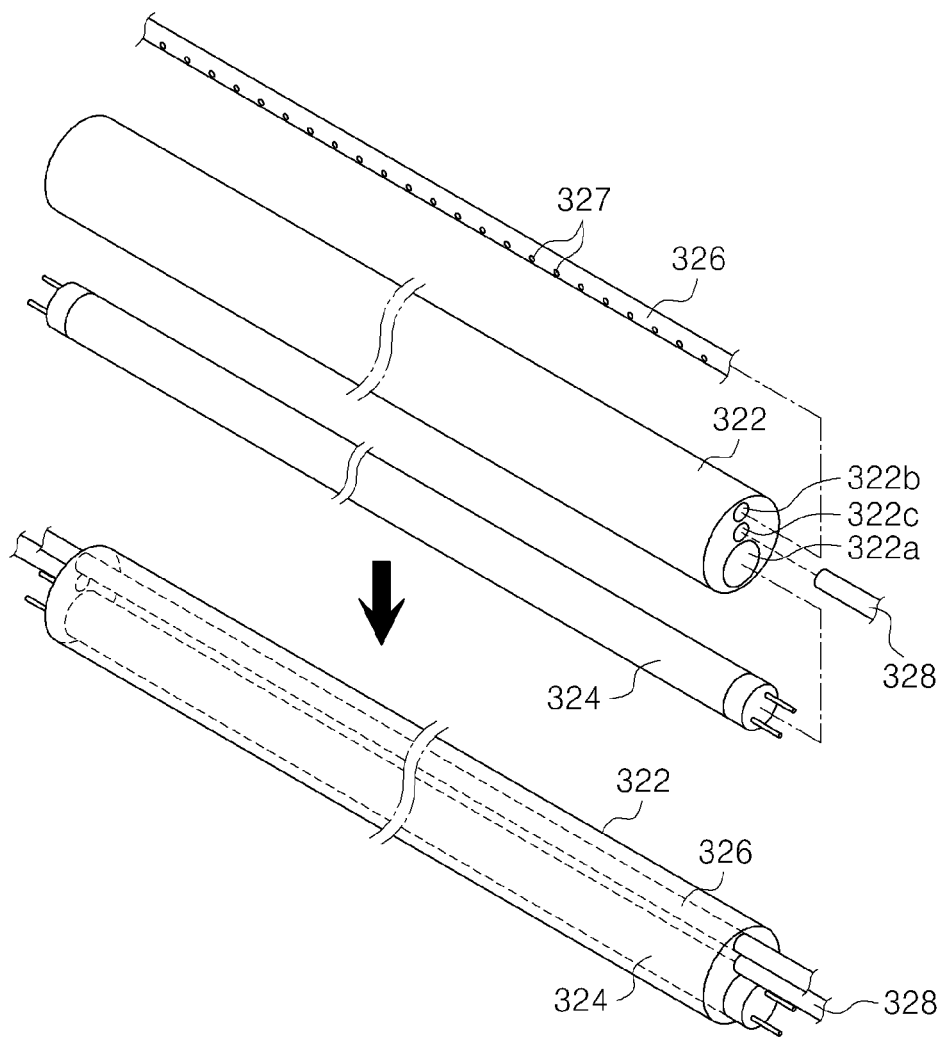
FIG. 6 is a view showing a configuration of a heat source.
Figure 7:
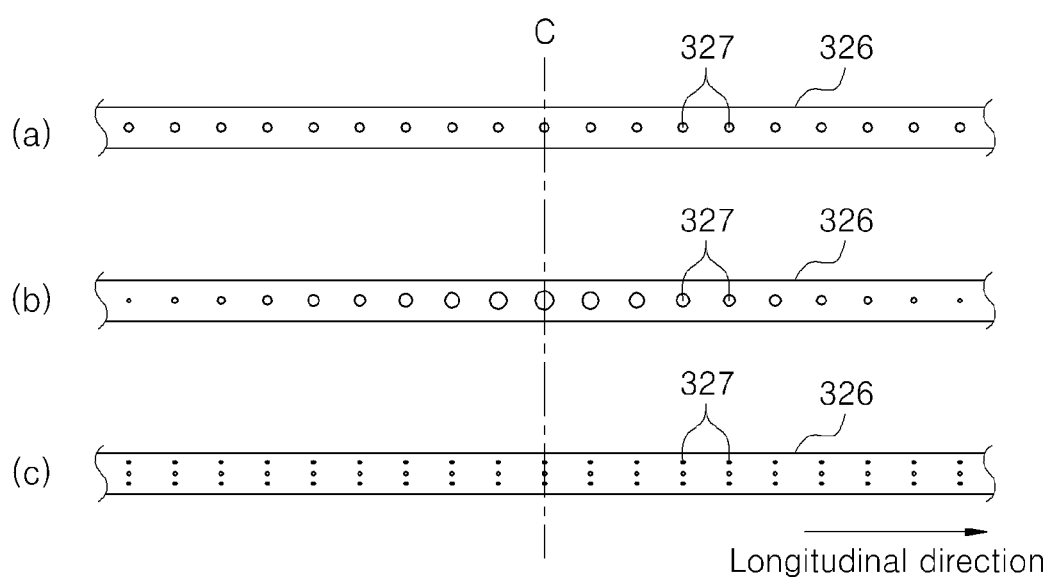
FIG. 7 is a view showing various examples of a first cooling conduit.
Figure 8:
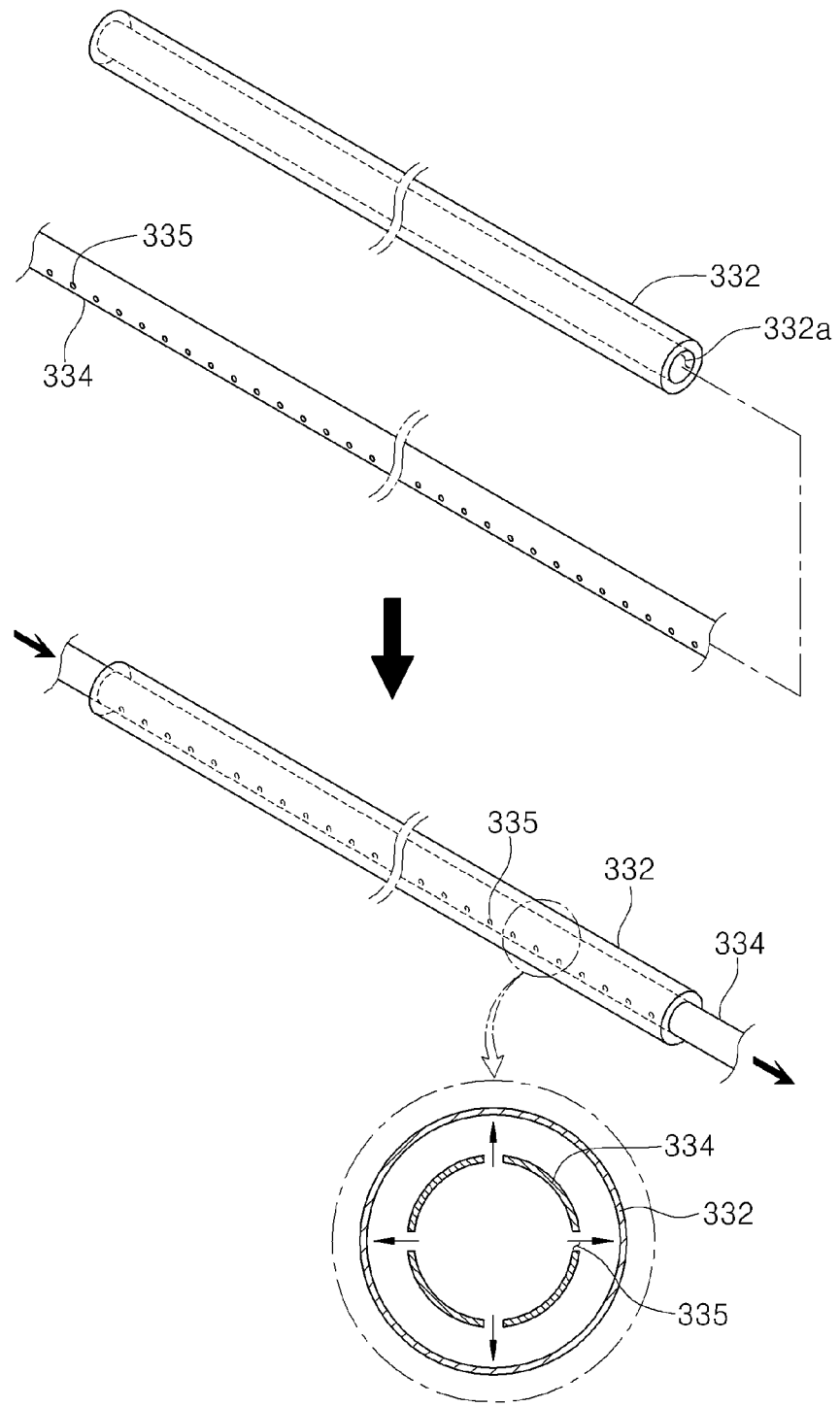
FIG. 8 is a view showing a configuration of an auxiliary cooling unit.

FIG. 1 a view schematically showing a configuration of a substrate processing apparatus in accordance with an exemplary embodiment; FIG. 2 is a cross-sectional view of a substrate processing apparatus, taken along line X-X of FIG. 1; FIG. 3 is a cross-sectional view of a substrate processing apparatus, taken along line Y-Y of FIG. 1; FIG. 4 is a cross-sectional view of a substrate processing apparatus, taken along line Z-Z of FIG. 1; FIG. 5 is an exploded perspective view of a heat source device in accordance with an exemplary embodiment; FIG. 6 is a view showing a configuration of a heat source; FIG. 7 is a view showing various examples of a first cooling conduit; and FIG. 8 is a view showing a configuration of an auxiliary cooling unit.

Referring to FIGS. 1 and 4, a substrate processing apparatus may include a chamber 100 that provides an inner space in which a substrate S is processed, a substrate support 200 that is provided inside the chamber 100 and supports the substrate S, and a heat source device 300 that is provided parallel to the substrate support 200 in the chamber 100 so as to heat the substrate. Also, the substrate processing apparatus may be provided with a susceptor 120 so as to indirectly heat the substrate S. The susceptor 120 is not essential component, but the case in which the substrate processing apparatus includes the susceptor 120 will be descried herein, and if necessary, a structure in which the susceptor is not provided will be also described.

The chamber 100 has a configuration having a space in which the substrate S is accommodated and heated, i.e., a heating space in which vacuum is created, and may have a shape of a hollow box or a hollow block as illustrated. Also, the chamber 100 may be manufactured into a single body, but may have an assembled body in which several components are connected or coupled. In this case, a sealing part (not shown) may be additionally provided at a connection portion between the components. Accordingly, energy inputted into a device may be saved during heating or cooling the substrate S.

The chamber 100 may include a body 102 having a hollow shape and a door 104 coupled to one side of the body 102. Here, in the body 102, surfaces facing each other, for example, top and bottom surfaces or both side surfaces may be opened so as to be coupled to a heat source device 300. Also, in the body 102, a gate 103 may be provided in a direction perpendicular to a coupling direction of the heat source device 300 so that the door 104 is coupled.

The chamber 100 may be disposed vertically or horizontal. For example, when a substrate with a large area is processed, the chamber 100 may be disposed vertically so as to suppress the deflection of the substrate. Also, when a substrate has a relatively small area, the chamber may be disposed horizontally.

In the outside of the chamber 100, a gas supply part (not shown) may be provided to supply a process gas and a cooling gas into the inner space of the camber 100. In one side surface of the chamber 100, i.e., one side surface of the body 102, a gas injection hole 106 may be defined to inject the process gas and the cooling gas, which are supplied from the gas supply part, into the chamber 100. In the other surface of the body 102 facing the gas supply hole 106, a gas discharge hole 108 may be defined to discharge the gas inside the chamber 100. Here, while the substrate is processed in the chamber 100, the process gas may be supplied through the gas injection hole 106, and the process gas may be discharged through the gas discharge hole 108. After the substrate is processed, the cooling gas may be supplied through the gas injection hole 106, and the cooling gas may be discharged through the gas discharge hole 108.

In order to effectively discharge the gas inside the chamber 100 through the gas discharge hole 108, an exhaust line (not shown) may be connected to the gas discharge hole 108 may be connected, and a pump (not shown) is installed to the exhaust line. Through this configuration, a pressure control such as the vacuum creation inside the chamber may be performed.

In an inner wall of the chamber 100, a liner (not shown) may be provided. The liner is disposed in all regions inside the chamber to which the process gas reaches, and thus may adsorb pollutants that are produced during the process. By applying this liner to the inner wall of the chamber 100, a maintenance period for equipment may be extended by replacing only the liner without cleaning whole equipment. Here, the liner may be formed of at least one of graphite or graphite coated with silicon carbide, silicon carbide, silicon nitride, alumina ($Al_2O_3$), aluminum nitride, and quartz.

The substrate support 200 may support the substrate S in the chamber 100. When the chamber 100 is disposed vertically, the substrate support 200 may be provided as illustrated in FIG. 1 such that the substrate S may be inserted into and withdrawn from the chamber 100 while being fixed vertically or perpendicularly. Here, the substrate support 200 is connected to the door 104, and may be inserted into the chamber 100 or withdrawn to the outside of the chamber 100, through the gate 103.

Also, when the chamber 100 is disposed horizontally, the substrate support may be installed in the chamber 100 so as to seat the substrate S thereon.

The susceptor 120 is disposed parallel to the substrate support 200, and functions as preventing the substrate S from being exposed directly to radiation light discharged from the heat source and heating indirectly the substrate S. The substrate S used in the current embodiment is for the deposition of graphene, and may include a metal thin plate such as nickel (Ni), copper (Cu), cobalt (Co), molybdenum (Mo), magnesium (Mg), platinum (Pt), silver (Ag), chrome (Cr), manganese (Mn), titanium (Ti), and tungsten (W). When the radiation light is directed radiated to the metal thin plate, lots of time and power for heating the substrate S up to the process temperature are consumed due to the reflection of the radiation light. Therefore, the susceptor 120 is provided between the heat source and the substrate S so as to prevent the radiation light from being reflected from the substrate S, and the heated susceptor 120 is used to indirectly heat the substrate S. This susceptor 120 may be formed of at least one of graphite or graphite coated with silicon carbide, silicon carbide, silicon nitride, alumina ($Al_2O_3$), aluminum nitride, and quartz.

When heat source devices 300 are provided at both sides of the chamber 100, as illustrated in the drawing, a pair of susceptors 120 may be used, but when the heat source device 300 is provided at one side of the chamber 100, one susceptor may be used. Here, the susceptor 120 may be disposed between the substrate S and the heat source device 300.

When the pair of the susceptor 120, the substrate S may be maintained at a constant temperature during the deposition of graphene, thereby facilitating the deposition of graphene.

This susceptor 120 is fixed and installed to a wall body of the chamber 100 by using at least one support (not shown). Here, the support may be installed while not interfering with the introduction of the process gas and the travel of the radiation light that is radiated from the heat source device 300.

The susceptor 120 may be provided with a sensor to measure a temperature of the susceptor 120. The sensor may be provided in at least one of the pair of the susceptors 120, or the sensors may be provided on a plate shape susceptor 120 at a constant distance, or the sensors may be provided in a central region or an edge region, but position of the sensors is not limited thereto. In this case, the sensor is provided in the susceptor 120 to indirectly measure a temperature of the substrate S. That is, the substrate S is indirectly heated by the susceptor 120, and thus a temperature of the substrate S may be identified from the temperature measurement of the susceptor 120.

Referring to FIG. 5, the heat source device 300 is coupled to the chamber 100 and thus may heat the susceptor 120 or the substrate S installed in the chamber 100. The heat source device 300 may include a supporting body 310, a heat source unit 320 installed to the supporting body 310, and a controller (not shown). Also, the heat source device 300 may further include an auxiliary cooling unit 330.

The supporting body 310 may be formed to have a size corresponding to an area of the chamber 100, i.e., a side surface area of the opened body 102, and may be connected to the chamber 100. The supporting body 310 is connected to both sides of the body 102 and may seal the inside of the body 102.

The supporting body 310 may have a hollow shape in which one side thereof is opened. The supporting body 310 may have a cuboid shape in which one side thereof is approximately opened, and a plurality of first insertion holes 312 may be defined in surfaces facing each other so as to fix the heat source unit 320. Here, the surfaces facing each other may be both side surfaces or top and bottom surfaces. The plurality of first insertion holes 310 may be disposed spaced apart from each other, and may be disposed while forming a row with the same distance from the susceptor 120.

Also, the supporting body 310 may have a plurality of second insertion holes 316 capable of fixing the auxiliary cooling unit 330. The second insertion holes 316 may be disposed between the first insertion holes 312, respectively. Here, the second insertion hole 316 may be provided closer to the susceptor 120 or the body 102 than the first insertion hole 312, and may be provided while forming a row with the same distance from the susceptor 120.

Also, a concave groove 314 may be provided in the supporting body 310 for collecting the radiation light radiated from the heat source unit 310 and reflecting the radiation light toward the substrate S or the susceptor 120. Also, in order to efficiently reflect the radiation light toward the substrate S or the susceptor 120, a reflective body (not shown) may be applied to inner surface of the supporting body 310.

The heat source unit 320 may be disposed to the supporting body 310 while being parallel to the substrate S or the susceptor 120, and may be provided in plurality and spaced apart from each other in the supporting body 310.

Referring to FIG. 6, the heat source unit 320 may include: a first light transmission conduit 322 fixed to the insertion hole 312 of the supporting body 310; a heat source 324 inserted into and fixed to the first light transmission conduit 322; and a first cooling conduit 326 disposed inside the first light transmission conduit 322 while being spaced apart from the heat source 324, and having a first spraying hole 327 to spray a cooling gas.

The first light transmission conduit 322 may be disposed while extending in one direction of the supporting body 310, and that is, may be disposed while crossing the supporting body 310 in one direction. The first light transmission conduit 322 may have a hollow shape in which both ends thereof are closed, and the both ends may have a plurality of fixing holes to which the heat source 324 and the first cooling conduit 326 may be inserted and fixed. Here, a plurality of fixing holes may include a first fixing hole 322a to insert and fix the heat source 324 and a second fixing hole 322b to fix the first cooling conduit 326. Also, the first light transmission conduit 322 may include a discharging hole 322c which is defined at each of both ends and discharges a cooling gas, which is sprayed into the first light transmission conduit 322, to the outside, and the discharging hole 322c may be connected to a discharging conduit 328 through which the cooling gas is discharged to the outside. Here, the discharging hole 322c may be defined at any position in both ends of the first light transmission conduit 322, but in the current embodiment, may be defined between the first fixing hole 322a and the second fixing hole 322b.

The first light transmission conduit 322 may be formed using quartz or sapphire so as to endure a high temperature condition and transmit radiation light that is discharged from the heat source 324.

Also, the first light transmission conduit 322 may be provided with a sensor to measure a temperature inside the first light transmission conduit 322. Hereinafter, a sensor provided in the first light transmission conduit 322 is referred to as a first sensor, and a sensor provided in the susceptor 120 is referred to as a second sensor. Here, the first sensor may be installed at a position corresponding to a position in which the second sensor is installed. This will be described later.

The heat source 324 may have a linear shape extending in one direction, may include at least any one of a tungsten halogen lamp, a carbon lamp, or a ruby lamp, which discharge radiation light. Here, the heat source 324 may include a reflective body (not shown) so as to efficiently radiate the radiation light toward the susceptor 120 or the substrate S. The reflective body may be preferably disposed on an outer circumferential surface of the heat source 324, having a range of 20° to 300° from a central region. The reflective body may be formed by using ceramic, Ni, Ai-Au, or the like.

The heat source 324 may be inserted into the first light transmission conduit 322 through the first fixing hole 322a, and may be disposed in a longitudinal direction of the first light transmission conduit 322. A sealing member (not shown) may be disposed between the first fixing hole 322a and the heat source 324 to fix the heat source 324 to the first light transmission conduit 322 and also seal the inside of the first light transmission conduit 322.

The first cooling conduit 326 may be inserted into the first light transmission conduit 322 through the second fixing hole 322b, and may be disposed in longitudinal directions of the first light transmission conduit 322 and the heat source 324, and may be disposed to be spaced apart from the heat source 324 in the first light transmission conduit 322. Here, a sealing member (not shown) may be disposed between the first cooling conduit 326 and the second fixing hole 322b to seal the inside of the first light transmission conduit 322.

The first cooling conduit 326 may be spaced apart from the heat source 324 in the first light transmission conduit 322 and, more particularly, may be spaced apart from the heat source 324 in a parallel manner. Here, since the first cooling conduit 326 sprays a cooling gas to cool the heat source 324, it is preferable to be spaced a predetermined distance from the outer circumferential surface of the heat source 324.

The first cooling conduit 326 may be disposed at a position in which the radiation light discharged from the heat source 324 is not restricted from being radiated to the substrate S. For example, the first cooling conduit 326 may be disposed in a direction opposite to the substrate S or the susceptor 120 about the heat source 324 therebetween. Also, the first cooling conduit 326 may have a plurality of spraying holes 327 in the longitudinal direction of the first cooling conduit 326 so as to spray the cooling gas, which moves along the inside of the first cooling conduit 326, toward the heat source 324. The spraying holes 327 may be disposed at positions facing the heat source 324 in the first cooling conduit 326 so as to spray the cooling gas toward the heat source 324.

Referring to (a) of FIG. 7, a plurality of spraying holes 327 may be provided with the same diameter. Alternatively, referring to (b) of FIG. 7, a plurality of spraying holes 327 may be provided with different diameters with respect to a center C in the longitudinal direction of the first cooling conduit 326. The reason why the spraying holes 327 is provided with the different diameters is that, because the temperature of both edge regions is lower than the temperature of the central region in the heat source 324, a larger amount of the cooling gas is sprayed to the central region with the high temperature than the both edge regions, achieving uniform cooling along the longitudinal direction of the heat source 324. Also, referring to (c) of FIG. 7, a plurality of spraying holes 327 may be provided in a longitudinal direction or a circumferential direction of the first cooling conduit 326. In this case, the cooling gas is sprayed in the longitudinal direction and the circumferential direction of the heat source 324, and thus the heat source 324 may be rapidly cooled down.

The first cooling conduit may be connected to a supply cooling conduit 329 that conveys the cooling gas a cooling gas supplying device (not shown) equipped outside. Here, the supply conduit 329 may include: a first supply conduit 329a connected to a storage unit (not shown) that store the cooling gas; and a second supply conduit 329b branched from the first supply conduit 329a and connected to the respective first cooling conduit 326. The second supply conduit 329b may be connected to the first cooling conduit 326 so as to supply the cooling gas to both sides of the first cooling conduit 326. If the cooling gas is supplied from one side of the cooling conduit 326, the cooling gas is heated up while moving in the longitudinal direction of the first cooling conduit 326, and thus the cooling efficiency for the heat source 324 may be deteriorated in the other side of the first cooling conduit 326. That is, if the cooling gas is supplied from the one side of the first cooling conduit 326, an amount of heat becomes unbalanced in the longitudinal direction of the heat source 324, and thus the uniformity of cooling may be deteriorated according to positions of the substrate S. Therefore, when the cooling gas is supplied to both sides of the first cooling conduit 326 as in the present disclosure, the cooling gas may be uniformly sprayed in the longitudinal direction of the heat source 324, and the temperature deviation of the cooling gas in the longitudinal direction of the first cooling conduit 326 may be reduced.

As described above, when the heat source 324 is cooled down while the first cooling conduit 326 is provided in the heat source device 300, because the cooling gas is not introduced into the chamber 100, a variety of cooling gases may be used. That is, according to the related art, the cooling gas is supplied directly into the chamber to cool the heat source, but in the present disclosure, the heat source 324 and the substrate S may be independently cooled down. Therefore, various kinds of gases, which have not been used due to the pollution of the substrate S in the related art, may be used as a cooling gas for cooling the heat source 324. Here, the cooling gas may include at least one or more of clean dry air CDA, $N_2$, Ar, and He.

Also, the supply conduit 329 may be provided with a first regulator 340 for regulating a flow rate and a pressure of the cooling gas supplied to the first cooling conduit 326. The first regulator 340 is connected to the respective second supply conduit 329b branched from the first supply conduit 329a, and may independently regulate the flow rate and the pressure of the cooling gas supplied to the respective first cooling conduit 326 of the heat source unit 320. For example, the heat source unit 320 provided in an edge region of the supporting body 310 may have a temperature relatively lower than that of the heat source unit 320 provided in the central region. In this case, in order to rapidly decrease the temperature of the heat source unit 320 provided in the central region of the supporting body 310, a relatively larger amount of cooling gas may be supplied to the heat source unit 320 disposed in the central region than the heat source unit 320 disposed in the edge region.

The cooling gas sprayed into the first light transmission conduit 322 via the first cooling conduit 326 may be discharged through the discharging hole 322c. The discharging hole 322c may be connected to the discharging conduit 328, and the discharging conduit 328 may be connected to the cooling gas supplying device so as to circulate the cooling gas, or may be connected to a separate storage place.

The controller may control an operation of the first regulator 340. Here, the controller may control the operation of the first regulator 340 by using the temperature of the first light transmission conduit 322 measured by the first sensor and the temperature of the susceptor 120 measured by the second sensor. As previously described, the first sensor may be installed at a position corresponding to a position in which the second sensor is installed. Therefore, by comparing the temperature of the first light transmission conduit 322 with the temperature of the susceptor 120 having a position corresponding to the first light transmission conduit 322, the supply amount and the supply pressure of the cooling gas is regulated by the first regulator 340. For example, by comparing a first temperature measured by the first sensor with a second temperature measured by the second sensor, a relatively large amount of cooling gas may be supplied to the heat source unit 320 installed in a position in which the difference between the first temperature and the second temperature deviates from a predetermined range. Alternatively, temperatures are measured in a plurality of positions on the susceptor 120 by a plurality of second sensors, and then a relatively large amount of cooling gas may be suppled to the heat source unit 320 installed in a position corresponding a position in which has a relatively high temperature among the measured temperatures of the susceptor 120.

Also, the supply conduit 329 may be provided with a second regulator 350 for controlling a temperature of the cooling gas. Here, the second regulator 350 may be provided in a first supply conduit 329a. Therefore, the second regulator 350 may control the temperature of the cooling gas and provide the respective second supply conduit 329b with the cooling gas having the same temperature, thereby mitigating the non-uniform temperature of the heat source 324, which would be caused by a temperature difference between the cooling gases supplied to the respective second supply conduit 329b.

The auxiliary cooling unit 330 may be disposed between the heat source units 320 to cool the heat source 324, and may suppress the residual heat discharged from the heat source 324 from being transferred to the substrate S or the susceptor 120.

Referring to FIG. 8, the auxiliary cooling unit 330 may include: a second light transmission conduit 332; and a second cooling conduit 334 provided inside the second light transmission conduit 332 and having a second spraying hole 335 to spray a cooling gas. Here, the second light transmission conduit 332 may have a hollow cylindrical shape in which both ends thereof are closed, and the both ends may have a third fixing hole 332a to which the second cooling conduit 334 may be inserted and fixed.

The second cooling conduit 334 is spaced apart from an inner circumferential surface of the second light transmission conduit 332, and thus a cooling gas sprayed from the second spraying hole 335 may be introduced between the second light transmission conduit 332 and the second cooling conduit. The spraying holes 335 may be spaced apart from each other in a longitudinal direction of the second cooling conduit 334. Also, the second spraying holes 335 are spaced apart from each other in a circumferential direction of the second cooling conduit 334, and thus a surrounding temperature of the second light transmission conduit 332 may be efficiently reduced.

The auxiliary cooling unit 330 may be provided parallel to the heat source unit 320, or may be provided between the heat source unit 320 and the adjacent heat source unit 320, for example, in middle thereof. The auxiliary cooling unit 330 may be provided at a position in which the radiation light discharged from the heat source unit 320 is not restricted from arriving at the substrate S or the susceptor 120.

Through this configuration, the auxiliary cooling unit 330 may cool the second light transmission conduit 332 by using the cooling gas sprayed from the second spraying hole 335 of the second cooling conduit 334. When the second light transmission conduit 332 is cooled down, the surrounding temperature of the second light transmission conduit 332 may be decreased. Therefore, the auxiliary cooling unit 330 may decrease the surrounding temperature of the second light transmission conduit 332, thereby suppressing the residual heat discharged from the heat source unit 320 from being transferred to the susceptor 120 or the substrate S.

Now, a method for processing a substrate by using the substrate processing apparatus having the above configuration will be described.

Figure 9:
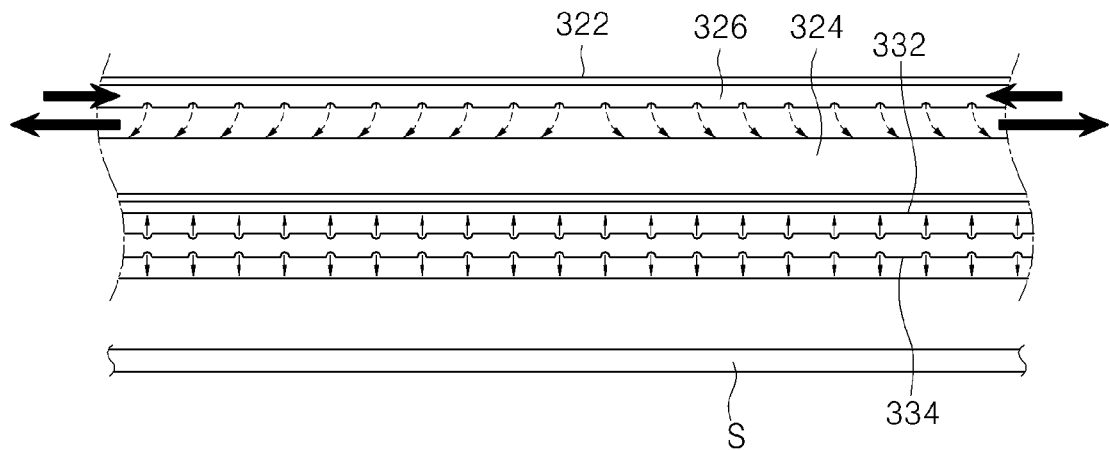
FIG. 9 is a view illustrating a state in which a substrate is cooled down by using a substrate processing apparatus in accordance with an exemplary embodiment.
Figure 10:
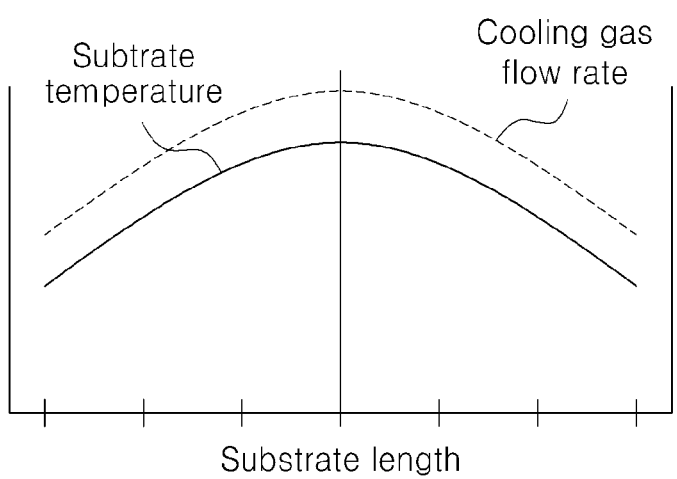
FIG. 10 is a view to describe a correlation between a temperature of substrate and a supply amount of cooling gas.

FIG. 9 is a view illustrating a state in which a substrate is cooled down by using a substrate processing apparatus in accordance with an exemplary embodiment, and FIG. 10 is a view to describe a correlation between a temperature of substrate and a supply amount of cooling gas.

First, the substrate S is fixed to the substrate support 200, and the substrate S is inserted into the chamber 100 by moving the door 104. Here, the substrate S may include at least any one of nickel (Ni), copper (Cu), cobalt (Co), molybdenum (Mo), magnesium (Mg), platinum (Pt), silver (Ag), chrome (Cr), manganese (Mn), titanium (Ti), and tungsten (W), and may be formed in thin plate shape.

The gate 103 is closed by the door 104, and the substrate S may be disposed between the susceptors 104 in the chamber 100.

Then, a gas inside the chamber 100 is made to be discharged such that an inner pressure of the chamber becomes in a vacuum state. Here, the inner pressure of the chamber 100 may be controlled in range of 0.01 to 50 torr.

Subsequently, a power is applied to the heat source unit 320 to heat the susceptor 120 by the radiation light discharged from the heat source 324, and the process gas is supplied through the gas injection hole 106, and as a result, the graphene is deposited on the substrate S. Here, the susceptor 120 may be heated up to 500° C. to 1050° C., and the process gas may include gases containing carbon, such as $H_4$, $C2H_6$, $C_2H_2$, $C_6H_6$, or the like. While the graphene is deposited on the substrate S, the process gas is supplied through the gas injection hole 106, and at the same time, non-reacted gas, residuals, and the like may be discharged through the gas discharge hole 108.

When the graphene has been deposited on the substrate S, the power applied to the heat source unit 320 is cut off, and the cooling gas is supplied to the heat source device 300 via the cooling gas supplying device. Referring to FIG. 9, the cooling gas is supplied into the first light transmission conduit 322 through the first cooling conduit 326, and the cooling gas is sprayed directly to the heat source 324 through the spraying hole 327. Here, the cooling gas is sprayed in a longitudinal direction of the heat source 324 through the plurality of spraying holes 327 provided in the first cooling conduit 324. When the cooling gas is sprayed directly to the heat source 324 in a state in which the power is cut off in the heat source 324, the heat source 324 may be rapidly cooled down. Therefore, a phenomenon, in which the cooling for the substrate is delayed due to the residual heat of the heat source 324, may be suppressed or prevented. Also, since the cooling gas is sprayed in the longitudinal direction of the heat source 324, the uniform cooling may be performed in the longitudinal direction of the heat source 324. Particularly, since the cooling gas is supplied from both sides in the longitudinal direction of the heat source 324, the temperature change of the cooling gas, which occurs in the longitudinal direction of the heat source 324, may be suppressed, thereby efficiently cooling the heat source 324. Through this, the unbalance of temperature according to positions of the substrate S may be prevented, and thus the reliability of the deposited graphene may be ensured. Also, since the cooling gas is not introduced into the chamber 100, the graphene deposited on the substrate S is not affected, and thus various kinds of cooling gases may be used such that there is little limitation to the types of cooling gas.

Also, the cooling gas is supplied to the second cooling conduit 334 of the auxiliary cooling unit 330, and thus the surrounding temperature of the auxiliary cooling unit 330 may be made to decrease. In this case, the cooling gas is sprayed into the second light transmission conduit 332 through the second spraying hole 335 provided in the second cooling conduit 334, and thus the temperature of the second light transmission conduit 330 may be decreased, i.e., cooled down. When the temperature of the second light transmission conduit 332 is decreased, the temperature around the second light transmission conduit 332 may be decreased, thereby suppressing the residual heat discharged from the heat source unit 320 from being transferred to the substrate S or the susceptor 120. Therefore, the cooling of the substrate S may be prevented from being delayed due to the residual heat discharged from the heat source unit 320, or the temperature according to positions of the substrate S may be prevented from being non-uniform.

Although the method for uniformly cooling the heat source 324 by directly spraying the cooling gas to the heat source 324 is described herein, the substrate may be also cooled down by supplying a cooling gas into the chamber 100 during the cooling of the heat source 324. Here, the cooling gases for cooling the heat source 324 and the substrate S may be the same, and alternatively, different kinds of the cooling gases may be used.

FIG. 10 is a view to describe a correlation between a temperature of substrate and a supply amount of cooling gas.

Referring to FIG. 10, the relatively higher temperature is measured in the central region of the substrate than the edge region. In this case, when a relatively larger amount of cooling gas is supplied to the central region of the substrate having the high temperature than the edge region, the uniform cooling is possible over the entire substrate. That is, when the larger amount of the cooling gas is supplied to the region having high temperature than the region having low temperature, the temperature of the heat source may be made rapidly and uniformly to decrease, thereby mitigating the non-uniform temperature that may occur according to position of the substrate.

According to an embodiment of the present disclosure, the substrate having large area may be uniformly cooled down. That, the cooling gas may be supplied directly the heat source, thereby rapidly and uniformly cooling the heat source. Therefore, a phenomenon, in which the cooling for the substrate is delayed after the substrate is processed, due to the residual heat of the heat source, may be suppressed or prevented. Also, the plurality of heat sources may be cooled down independently, thereby improving the unbalance of temperature according to position of the substrate, which is caused by the difference between the cooling rates.

Also, the substrate processing apparatus in accordance with an exemplary embodiment may apply the rapid thermal process (RTP) method, thereby heating the substrate accommodated in the chamber to enable the mass-production of the graphene. Therefore, the commercialization of the graphene, which has many electrical, mechanical, and chemical advantages, may be promoted.

Particularly, it may prevent the quality of the graphene from being degraded due to the non-uniform temperature according to positions, which may be caused while the graphene is synthesized by using the substrate having large surface.

Although the present invention has been described with reference to the accompanying drawings and foregoing embodiments, the present invention is not limited thereto and also is limited to the appended clamis. Thus, it is obvious to those skilled in the art that the various changes and modifications can be made in the technical spirit of the present invention.

What is claimed is:

1. A heat source device, comprising:
   a first light transmission conduit having a hollow shape;
   a heat source inserted into and fixed to the first light transmission conduit;
   a first cooling conduit disposed inside the first light transmission conduit while being spaced apart from the heat source, and having a first spraying hole for spraying a cooling gas; and
   a supporting body in which an open hollow shape is defined in one side and a first insertion hole is defined in a side surface,
   wherein the first light transmission conduit is fixed into the first insertion hole and disposed to pass through the supporting body;
   wherein the first spraying hole is one of a plurality of first spraying holes, and at least two of the plurality of first spraying holes are spaced apart from each other in longitudinal direction and a circumferential direction of the first cooling conduit.

2. The heat source device of claim 1, wherein the first light transmission conduit has, at both ends, a first fixing hole to fix the heat source and a second fixing hole to fix the first cooling conduit, and a discharging hole is defined between the first fixing hole and the second fixing hole so as to discharge the cooling gas to the outside.

3. The heat source device of claim 2, wherein the first spraying hole is one of the plurality of first spraying holes, and at least two of the plurality of first spraying holes are spaced apart from each other in a longitudinal direction of the first cooling conduit, and the plurality of first spraying holes have the same diameter.

4. The heat source device of claim 2, wherein the first spraying hole is one of the plurality of first spraying holes, and at least two of the plurality of first spraying holes are spaced apart from each other in a longitudinal direction of the first cooling conduit, and the plurality of first spraying holes have diameters that decrease gradually from a center to both edges in a longitudinal direction of the first cooling conduit.

5. The heat source device of claim 1, wherein the supporting body has a second insertion hole defined on the side surface thereof, and the heat source comprises an auxiliary cooling unit fixed into the second insertion hole and disposed parallel to the first light transmission conduit.

6. The heat source device of claim 5, wherein the auxiliary cooling unit comprises:

a second light transmission conduit having a hollow shape; and a second cooling conduit provided inside the second light transmission conduit and having a second spraying hole to spray a cooling gas.

7. The heat source device of claim 6, wherein the auxiliary cooling unit is provided in one side of the first light transmission conduit.

8. The heat source device of claim 7, wherein the heat source device comprises a first sensor to measure a temperature of the first light transmission conduit.

9. The heat source device of claim 1, wherein the heat source device comprises a first regulator that is provided in a supply conduit to supply a cooling gas to the first cooling conduit and regulates a supply amount and a supply pressure of the cooling gas.

10. The heat source device of claim 9, wherein the heat source device comprises a second regulator that is provided in the supply conduit to supply the cooling gas to the first cooling conduit and controls a temperature of the cooling gas.

11. A substrate processing apparatus, comprising:

a chamber having an inner space in which a substrate is processed;

a substrate support provided inside the chamber and supporting the substrate; and a heat source device comprising a supporting body provided in at least one side of the chamber, and a heat source unit provided parallel to the substrate support so as to heat the substrate, wherein the heat source unit comprises: a first light transmission conduit connected to the supporting body; a heat source provided inside the first light transmission conduit; and a first cooling conduit provided inside the first light transmission conduit while being spaced apart from the heat source, and having a first spraying hole for spraying a cooling gas;

a supporting body in which an open hollow shape is defined in one side and a first insertion hole is defined in a side surface, wherein the first light transmission conduit is fixed into the first insertion hole and disposed to pass through the supporting body;

wherein the first spraying hole is one of a plurality of first spraying holes, and at least two of the plurality of first spraying holes are spaced apart from each other in a longitudinal direction and a circumferential direction of the first cooling conduit.

12. The substrate processing apparatus of claim 11, wherein the heat source device comprises a plurality of heat source units and a first regulator that regulates a supply amount and a supply pressure of the cooling gas supplied to each of heat source units.

13. The substrate processing apparatus of claim 12, wherein the heat source device comprises a second regulator that controls a temperature of the cooling gas.

14. The substrate processing apparatus of claim 13, wherein the first light transmission conduit has a discharge hole through which the cooling gas is discharged to the outside.

15. The substrate processing apparatus of claim 11, wherein the heat source device comprises an auxiliary cooling unit connected to the supporting body and disposed parallel to the heat source unit.

16. The substrate processing apparatus of claim 15, wherein the auxiliary cooling unit comprises:

a second light transmission conduit having a hollow shape; and a second cooling conduit provided inside the second light transmission conduit and having a second spraying hole to spray a cooling gas.

17. The substrate processing apparatus of claim 16, wherein the auxiliary cooling unit is disposed closer to the substrate support than the heat source unit.

* * * * *